United States Patent
Yang

(10) Patent No.: US 12,248,042 B2
(45) Date of Patent: Mar. 11, 2025

(54) METHOD AND SYSTEM FOR CONTROLLING A RAMPING PROCESS OF A MAGNETIC RESONANCE IMAGING DEVICE

(71) Applicant: Siemens Healthcare Limited, Camberley (GB)

(72) Inventor: Hai Ning Yang, Shenzhen (CN)

(73) Assignee: Siemens Healthcare Limited, Camberley (GB)

( * ) Notice: Subject to any disclaimer, the term of this patent is extended or adjusted under 35 U.S.C. 154(b) by 0 days.

(21) Appl. No.: 18/108,812

(22) Filed: Feb. 13, 2023

(65) Prior Publication Data

US 2023/0266416 A1 Aug. 24, 2023

(30) Foreign Application Priority Data

Feb. 21, 2022 (EP) ..................... 22157850

(51) Int. Cl.
*G01R 33/3815* (2006.01)
*G01R 33/38* (2006.01)

(52) U.S. Cl.
CPC ..... *G01R 33/3815* (2013.01); *G01R 33/3804* (2013.01)

(58) Field of Classification Search
CPC ............ G01R 33/3815; G01R 33/3804; G01R 33/543
See application file for complete search history.

(56) References Cited

U.S. PATENT DOCUMENTS

| | | | | |
|---|---|---|---|---|
| 7,298,602 | B2* | 11/2007 | Knight | G01R 33/3815 361/141 |
| 10,978,943 | B2* | 4/2021 | Wu | H01F 6/02 |
| 2009/0280989 | A1 | 11/2009 | Astra et al. | |
| 2014/0085021 | A1* | 3/2014 | Blakes | H01F 6/04 335/216 |
| 2015/0255977 | A1 | 9/2015 | Jonas et al. | |
| 2019/0011511 | A1* | 1/2019 | Stainsby | G01R 33/3815 |
| 2020/0400764 | A1 | 12/2020 | Stainsby et al. | |

* cited by examiner

*Primary Examiner* — Daniel R Miller
(74) *Attorney, Agent, or Firm* — Banner & Witcoff Ltd.

(57) ABSTRACT

Techniques are provided for controlling a ramping process of a superconducting magnet of a magnetic resonance imaging device comprising the steps of: acquiring an information indicating a status of a cryocooler configured for cooling of the superconducting magnet via an interface, acquiring an information on a parameter of the superconducting magnet via an interface, determining an operational status of the magnetic resonance imaging device in dependence of the information indicating the status of the cryocooler and/or the information on the parameter of the superconducting magnet via a processing unit and providing a control signal via a control unit, wherein the control signal is configured to control the ramping process of the superconducting magnet. The disclosure also relates to a magnetic resonance imaging system comprising a control unit configured to provide a control signal for controlling the ramping process of the superconducting magnet.

16 Claims, 3 Drawing Sheets

METHOD AND SYSTEM FOR CONTROLLING A RAMPING PROCESS OF A MAGNETIC RESONANCE IMAGING DEVICE

CROSS-REFERENCE TO RELATED APPLICATIONS

The present application claims priority to and the benefit of Europe patent application no. EP 22157850.3, filed on Feb. 21, 2022, the contents of which are incorporated herein by reference in their entirety.

TECHNICAL FIELD

The disclosure relates to a computer-implemented method for controlling a ramping process of a superconducting magnet. The disclosure also relates to a magnetic resonance imaging system comprising a control unit configured to provide a control signal for controlling the ramping process of the superconducting magnet.

BACKGROUND

In recent times, the consideration of magnetic resonance imaging systems comprising a very low mass of cryogenic fluid for cooling of superconducting magnets (i.e. "dry magnets") has gained momentum. Having a low mass of cryogenic fluids is advantageous, as it reduces costs associated with refilling the cryogenic fluid when servicing or maintaining the magnetic resonance imaging device. The costs of cryogenic fluids rise each year, as the provision of cryogenic fluids is energy-intensive and cryogenic fluids such as helium escape the earth's atmosphere.

The use of dry magnets may be instrumental in reducing maintenance costs associated with magnetic resonance imaging devices, as well as the energy demand required for the provision of cryogenic fluids. However, a lower mass of cryogenic fluid effectively decreases the thermal capacity of the cooling system and increases susceptibility to unintended ramp-downs of the magnet, which in turn can significantly reduce availability or uptime of the magnetic resonance imaging device. These challenges may prevent commercial success of magnetic resonance imaging devices comprising dry magnets and pose a challenge to operators.

SUMMARY

It is therefore an object of this disclosure to provide a means for increasing an uptime of a magnetic resonance imaging system comprising dry magnet technology. This object is achieved by a method, a magnetic resonance imaging system, and a computer program product according to the embodiments described throughout the disclosure, including the claims.

In an embodiment, a computer-implemented method for controlling a ramping process of a superconducting magnet of a magnetic resonance imaging device comprises the steps:
  acquiring an information (also referred to herein as cryocooler status data) indicating a status of a cryocooler configured for cooling of the superconducting magnet via an interface;
  acquiring an information (also referred to herein as superconducting magnet data) on a parameter of the superconducting magnet via an interface;
  determining an operational status of the magnetic resonance imaging device in dependence of the information indicating the status of the cryocooler and/or the information on the parameter of the superconducting magnet via a processing unit; and
  providing a control signal via a control unit, wherein the control signal is configured to control the ramping process of the superconducting magnet, and wherein the control signal depends on the determined operational status of the magnetic resonance imaging device and on the information indicating the status of the cryocooler.

A ramping process may be a process related to or involved in providing superconducting conditions within a superconducting magnet or removing superconducting conditions within the superconducting magnet. For example, the ramping process may comprise a ramp-up of the superconducting magnet. A ramp-up of the superconducting magnet may be characterized by increasing an electrical current passing through coils of the superconducting magnet and/or decreasing the temperature of the coils of the superconducting magnet until a superconducting state is achieved.

In contrast, a ramp-down of the superconducting may be characterized by increasing the temperature of the coils of the superconducting magnet while decreasing the electrical current passing through the coils. For example, the superconducting magnet may be ramped down in a safe and/or controlled manner, thus minimizing possible damage to the magnetic resonance imaging device and/or people in proximity to the magnetic resonance imaging device.

The term "superconducting" may characterize a physical state of the superconducting magnet, wherein electrical resistance or electrical losses due to electrical current passing through the coils is minimal or substantially zero. The term "superconducting magnet" may apply to magnets comprising high temperature superconducting materials, but also magnets comprising low temperature superconducting materials. Such magnets and/or materials are known in the art.

An information indicating a status of a cryocooler may comprise an analog or digital signal, a time value, a variable based on a time value, a string, a structure or a signal in an arbitrary data format. For example, the information indicating the status of the cryocooler may quantify a duration or period of time in which a compressor (e.g. 33) of the cryocooler was inactive or out of operation. It is also conceivable that the information indicating the status of the cryocooler comprises a plurality of time values. For example, the information indicating the status of the cryocooler may comprise a current time and a time stamp of a latest turn-off of the compressor (e.g. 33).

In an embodiment, the information indicating the status of the cryocooler may be acquired via an interface. The interface may be a data interface, a communication interface, or the like. It is conceivable that the interface is coupled to a sensor configured for determining the turn-off time of the compressor (e.g. 33). However, the interface may also be coupled to a control unit of the cryocooler. Such a control unit may be configured for determining the turn-off time of the compressor (e.g. 33) and transmit the information indicating the status of the cryocooler to the interface.

The interface may receive the information indicating the status of the cryocooler from the sensor and/or the control unit of the cryocooler via a wireline communication and/or a wireless signal connection. In an embodiment, the interface is an integrated component of the magnetic resonance imaging device. For instance, the interface may be coupled to a control unit and/or a processing unit of the magnetic resonance imaging device. However, the interface may also be implemented as a standalone component.

The cryocooler may be implemented as a pulse tube refrigerator, a Gifford-McMahon refrigerator, a Sterling cryocooler, a Joule-Thomson cryocooler, and the like. In an embodiment, the cryocooler is configured to cool the cryogenic fluid to a predetermined temperature and ensure superconducting conditions in the coils of the superconducting magnet. For cooling the cryogenic fluid, the cryocooler may comprise components such as the compressor (e.g. 33) and a coldhead.

An information on a parameter of the superconducting magnet may comprise any suitable value, such as a measurement value or an estimated value, and/or any suitable information that allows for a quantification of a physical and/or electrical property of the superconducting magnet. A parameter of the superconducting magnet may be characterized by a value, e.g. a measurement value, related to a physical and/or an electrical property of the superconducting magnet.

In one embodiment, acquiring the information on the parameter of the superconducting magnet comprises acquiring a value of an electrical property of the superconducting magnet via at least one sensor. The at least one sensor may comprise a current clamp, a Rogowski coil, a voltage measuring device, a current transformer, a shunt resistor, or any other suitable measuring device for determining an electrical property of the superconducting magnet.

However, the at least one sensor may also be configured to determine a physical property of the superconducting magnet. Such a physical property of the superconducting magnet may comprise, for example, a temperature of the superconducting magnet and/or a magnetic field provided via the superconducting magnet.

In providing at least one sensor configured to acquire an electrical property and/or a physical property of the superconducting magnet, an operational status of the magnetic resonance imaging device may favorably be assessed with higher accuracy and/or confidence. For instance, in acquiring an electrical property or multiple properties of the superconducting magnet, the operational status of the magnetic resonance imaging device may be assessed directly and with higher reliability. For acquiring multiple properties of the superconducting magnet, one or more sensors may be used.

The interface acquiring the information on the parameter of the superconducting magnet may correspond to the interface for acquiring the information indicating the status of the cryocooler. However, the interfaces may also be implemented as separate components.

An operational status of the magnetic resonance imaging device may be characterized by any information, value, and/or assessment related to a readiness of the superconducting magnet for performing a magnetic resonance imaging measurement. The operational status may comprise binary numbers, "true" or "false" conditions, limit values, or the like. It is conceivable that the operational status of the magnetic resonance imaging device represents an estimation whether the superconducting magnet is capable of performing a specific magnetic resonance measurement. For example, some magnetic resonance imaging measurements pose a lesser burden on the cooling requirement and may be performed even if the compressor is turned off and/or temperature conditions of the coils of the superconducting magnet are not optimal.

The operational status of the magnetic resonance imaging device may also comprise other and/or further information besides the assessment of a readiness of the superconducting magnet for performing a specific magnetic resonance imaging measurement. For example, the processing unit may determine the operational status of the magnetic resonance imaging device in dependence of a plurality of parameters, values, and/or other information. The plurality of parameters, values, and/or other information may represent a specific set of parameters and/or a specific parameter configuration characterizing the operational status of the magnetic resonance imaging device. In an embodiment, the plurality of parameters, values, and/or other information is arranged in a data format such as a structure, a tuple, and/or a matrix. In using specific sets of parameters and/or parameter configurations, multiple gradations or nuances of the operational status may favorably be conveyed. For example, a specific parameter configuration may convey the information that the superconducting magnet is "unready" for performing a magnetic resonance imaging measurement, but the superconducting magnet may be ramping up despite the compressor being inactive, thus likely causing an unintended or emergency ramp-down.

In an embodiment, the operational status of the magnetic resonance imaging device comprises an assessment of the turn-off time of the compressor and/or an assessment of the readiness of the superconducting magnet for performing a magnetic resonance imaging measurement.

The operational status of the magnetic resonance imaging device may be derived in dependence of the information indicating the status of the cryocooler and/or the information on the parameter of the superconducting magnet via the processing unit. For that purpose, the interface (or interfaces, as the case may be) may transfer the information indicating the status of the cryocooler and/or the information on the parameter of the superconducting magnet to the control unit and/or the processing unit.

A control signal may represent a dedicated signal for controlling a ramping process of the magnetic resonance imaging device. For instance, the control signal may comprise a signal for ramping down the magnetic resonance imaging device. A ramp-down may be required, for example, if the turn-off time of the compressor exceeds a predefined value and/or if an electrical property and/or physical property of the superconducting magnet indicates that the magnetic resonance imaging device is incapable of performing a magnetic resonance imaging measurement as intended. It is also conceivable that the control signal allows for an interruption of a ramp-up process.

In an embodiment, the processing unit transfers the control signal to the control unit of the magnetic resonance imaging device. Subsequently, the control unit may initiate the respective ramping process, but also maintain or interrupt a present ramping process.

In an embodiment, an occurrence of the unintended ramping process may advantageously be reduced or prevented. Furthermore, an enhanced reliability of ramp-down processes may be provided, especially when dealing with on-site problems such as defective sensors and/or broken cables.

As a further advantage, relying on low accuracy magnetic field sensors may be avoided in using at least one sensor determining an electrical property of the superconducting magnet. Thus, the uptime of the magnetic resonance imaging device may advantageously be increased or optimized.

According to an embodiment, the information on the parameter of the superconducting magnet acquired via the at least one sensor is an electrical voltage, an electrical current, a magnetic field, and/or a temperature of the superconducting magnet.

The at least one sensor may be any suitable measuring device configured for determining an electrical property of the superconducting magnet described above. However, the at least one sensor may also be a temperature sensor, a magnetometer, and/or a magnetic field probe. For example, a temperature sensor may be configured to acquire the temperature of the coil of the superconducting magnet.

It is conceivable that multiple sensors are used to acquire the information on the parameter of the superconducting magnet. At least two of the multiple sensors may be based on the same measurement principle or comprise different measurement principles.

In using multiple sensors, the reliability of the method for controlling a ramping process in accordance with the embodiments described herein may advantageously be increased. Furthermore, using electrical properties and/or temperatures may advantageously increase an accuracy of determining the operational status of the superconducting magnet.

According to an embodiment, acquiring the information indicating the status of the cryocooler comprises acquiring information indicating a capacity of the cryocooler for maintaining a predefined cooling condition.

A capacity of the cryocooler for maintaining a predefined cooling condition may relate to any suitable information characterizing an amount of time that cooling can be provided adequately and/or an amount of heat energy that can be discharged from the superconducting magnet via the cryocooler. In an embodiment, the information indicating the capacity of the cryocooler for maintaining the predefined cooling condition may relate to a situation and/or period of time wherein a compressor of the cryocooler is inactive or partially inactive. A predefined cooling condition may be characterized by a temperature level required for maintaining superconducting conditions within the superconducting magnet.

For example, the information indicating the capacity of the cryocooler for maintaining the predefined cooling condition may be determined in dependence of a volume of a condensed phase of a cryogen and/or a temperature of the cryogen. For this purpose, a level of a cryogen within a fluid reservoir of the cryocooler and/or a heat exchanger or wall of a coldhead of the cryocooler may be acquired via a sensor. A suitable sensor may be, for example, a temperature sensor, a level sensor, a pressure sensor, a conductivity sensor, and/or a combination of such sensors.

It is also conceivable that the information indicating the capacity of the cryocooler for maintaining the predefined cooling condition relates to pressure level provided via a compressor of the cryocooler. For this purpose, acquiring the information indicating the capacity of the cryocooler for maintaining the predefined cooling condition may comprise determining a pressure level of a compressor and/or a buffer tank via a suitable pressure sensor.

According to a further embodiment, acquiring the information indicating the status of the cryocooler comprises acquiring a turn-off time of a compressor of the cryocooler, wherein determining the operational status of the magnetic resonance imaging device comprises correlating the turn-off time of the compressor with at least one reference time.

In accordance with the present embodiment, the at least one reference time is characterized by a predefined time value or a predefined period of time. In one embodiment, the reference time comprises a turn-off time of the compressor that is associated with a high probability of a quench or an emergency ramp-down when performing a magnetic resonance imaging measurement or a plurality of magnetic resonance imaging measurements. In other words, the compressor may have been inactive for too long, and thus a successful performance of the magnetic resonance imaging measurement may be improbable or impossible. The at least one reference time may be based on experimental or theoretical considerations regarding a possibility of maintaining superconducting conditions of the superconducting magnet when performing a magnetic resonance imaging measurement.

Correlating the turn-off time of the compressor with the at least one reference time may involve, for example, a comparison and/or a determination of a difference between the turn-off time of the compressor and the at least one reference time. For example, if the turn-off time of the compressor is equal to or exceeds the at least one reference time, the operational status of the magnetic resonance imaging device may be determined as "not ready". As a consequence, a ramp-down of the superconducting magnet may be initiated via the control signal. However, correlating the turn-off time of the compressor with the at least one reference time may also comprise classifying the turn-off time of the compressor in view of a plurality of references times to determine if a specific magnetic resonance imaging measurement or a set of specific magnetic resonance imaging measurements may still be performed. This classification may involve taking into account individual cooling requirements of the specific magnetic resonance imaging measurements.

Assessing the operational status of the magnetic resonance imaging device in dependence of the at least one reference time may advantageously facilitate an implementation of the method described herein and/or save resources, e.g. computational capacities of the processing unit. As a further advantage, a robustness and/or reproducibility of the method described herein may advantageously be increased.

In an embodiment, determining the operational status of the magnetic resonance imaging device comprises correlating the turn-off time of the compressor with at least a first reference time and a second reference time.

A first reference time may be characterized by a turn-off time of the compressor that still allows for the use of a specific magnetic resonance imaging measurement (i.e. a specific imaging sequence) or a set of specific magnetic resonance imaging measurements. The use of any other magnetic resonance imaging measurement may be associated with a high probability of an unintended or emergency ramp-down. Thus, if the first reference time exceeds the turn-off time of the compressor, specific magnetic resonance imaging measurements may still be performed.

The second reference time may relate to a turn-off time of the compressor that is associated with temperature problems in the superconducting magnet when performing a magnetic resonance imaging measurement. For instance, the second reference time may relate to a period of time, after which a ramp-down of the superconducting magnet should be initiated via the control signal. Thus, the superconducting magnet may intentionally be ramped down when the turn-off time of the compressor exceeds the second reference time to avoid an unintended ramp down (or emergency ramp down) during a magnetic resonance imaging measurement.

It is also conceivable that the first reference time relates to a turn-off time of the compressor that is associated with minor or insignificant changes of the temperature of the superconducting magnet when performing a specific magnetic resonance imaging measurement or a set of specific magnetic resonance imaging measurements. In this case, performing such a specific magnetic resonance imaging measurement or set of specific magnetic resonance imaging measurements may be permitted. The method may be repeated until the turn-off time of the compressor exceeds the second reference time and/or the magnetic resonance imaging measurement to be performed differs from the specific magnetic resonance imaging measurement or set of magnetic resonance imaging measurements. For this purpose, the method may comprise acquiring at least a second turn-off time of the compressor or further turn-off times of the compressor at predefined time intervals. A specific magnetic resonance imaging measurement or set of magnetic resonance imaging measurements may be characterized by a low examination time and/or a low impact on the temperature of the superconducting magnet in comparison to other or regular magnetic resonance imaging measurements.

According to an embodiment, the step of acquiring the information indicating the status of the cryocooler is repeated continuously or in discrete time intervals. It is conceivable that the step of acquiring the information indicating the status of the cryocooler is repeated until the turn-off time of the compressor exceeds the at least one reference time. Accordingly, in each step of the method, the turn-off time of the compressor may be correlated with the at least one reference time. Other steps of the method may be performed after the turn-off time of the compressor is equal to or exceeds the at least one reference time.

In continuously acquiring the turn-off time of the compressor, a reliability of preventing unintended ramp-downs of the superconducting magnet may advantageously be increased.

According to a further embodiment, determining the operational status of the magnetic resonance imaging device comprises assessing a readiness of the superconducting magnet for performing a magnetic resonance imaging measurement in dependence of the information on the parameter of the superconducting magnet.

As described above, the operational status of the superconducting magnet may be determined in dependence of the information indicating the status of the cryocooler and/or the information on the parameter of the superconducting magnet. For instance, the operational status of the magnetic resonance imaging device may be determined at least in dependence of an electrical current, an electrical voltage, and/or a temperature of a coil of the superconducting magnet.

According to an embodiment, assessing the readiness of the superconducting magnet for performing a magnetic resonance imaging measurement may require the turn-off time of the compressor to exceed at least one reference time. In other words, the turn-off time of the compressor exceeding the at least one reference time may be a prerequisite for assessing the readiness of the superconducting magnet for performing a magnetic resonance imaging measurement.

According to a further embodiment, the operational status of the magnetic resonance imaging device may be assessed as "ready" if the electrical voltage exceeds a predefined value and/or the temperature is below a predefined temperature level.

According to an embodiment, the operational status of the magnetic resonance imaging device is assessed to be ready for performing a magnetic resonance measurement and providing the control signal comprises providing a signal for ramping down the superconducting magnet.

In an embodiment, the superconducting magnet is intentionally ramped down to avoid an unintended ramp down (or emergency ramp down) during a magnetic resonance imaging measurement when the operational status of the magnetic resonance imaging device is assessed to be ready according to an embodiment described above.

In providing a signal for ramping down the superconducting magnet when the magnetic resonance imaging device is assessed to be ready but the turn-off time of the compressor exceeds at least one reference time, unintended ramp-downs may advantageously be prevented, even if physical or electrical properties of the superconducting magnet seem to be inconspicuous.

In a further embodiment, determining the operational status of the magnetic resonance imaging device comprises detecting a present ramping process in dependence of the information on the parameter of the superconducting magnet, wherein the magnetic resonance imaging device is assessed to be unready for performing a magnetic resonance measurement.

In accordance with the present embodiment, the ramping process is detected in dependence of the acquired electrical property and/or physical property of a coil of the superconducting magnet. The ramping process may be a ramp-up process or a ramp-down process of the superconducting magnet.

According to an embodiment, acquiring the information on the parameter of the superconducting magnet comprises acquiring an electrical voltage of the superconducting magnet via at least one sensor and wherein determining the operational status of the magnetic resonance imaging device comprises:
  determining the electrical voltage of the superconducting magnet to be below a first predefined value; and
  assessing the superconducting magnet to be ramping down.

For example, the at least one sensor may be configured to determine the electrical voltage of a coil of the superconducting magnet. For example, in case the electrical voltage of the coil is determined to be equal to or below the first predefined value of −50 mV, −75 mV, −100 mV, etc., the operational status of the magnetic resonance imaging device may be assessed as "ramping down". Thus, a control signal controlling the superconducting magnet to ramp down may presently be provided and be maintained. It is to be understood that the range presented for the first predefined value is provided by way of example and not limitation, and may be any suitable range depending on individual preconditions of the measurement device, the superconducting magnet, as well as the magnetic resonance imaging device.

According to an alternative embodiment, acquiring the information on the parameter of the superconducting magnet comprises acquiring a voltage of the superconducting magnet via at least one sensor, and wherein determining the operational status of the magnetic resonance imaging device comprises:
  determining the electrical voltage of the superconducting magnet to exceed a second predefined value; and
  assessing the superconducting magnet to be ramping up.

Referring to the example mentioned before, the at least one sensor may be configured to determine the electrical voltage of a coil of the superconducting magnet. If the electrical voltage of the coil is determined to be equal to or exceed the second predefined value of 50 mV, 75 mV, 100 mV, etc., and the turn-off time of the compressor is equal to or exceeds the at least one reference time, the operational status of the magnetic resonance imaging device may be assessed as "ramping up". In this case, a control signal stopping the ramping process may be provided to interrupt an unintended ramp-up of the superconducting magnet. Again, the range presented for the second predefined value is provided by way of example and not limitation, and may be any suitable range depending on individual preconditions of the measurement device, the superconducting magnet, as well as the magnetic resonance imaging device.

According to an embodiment, providing the control signal comprises providing a signal for interrupting a ramp-up of the superconducting magnet. Thus, automatic and/or unintended ramp-ups may advantageously be identified and interrupted before an emergency ramp-down or quench is performed.

In determining the operational status of the magnetic resonance imaging device in dependence of a physical property and/or an electrical property of the superconducting magnet, unintended ramping processes may advantageously be identified and interrupted. Thus, an uptime of the magnetic resonance imaging device may advantageously be increased.

In an embodiment, a magnetic resonance imaging system is provided comprising a magnetic resonance imaging device, a superconducting magnet, at least one interface, a processing unit, and a control unit.

The at least one interface is configured to acquire information indicating a status of a cryocooler and information on a parameter of the superconducting magnet, wherein the processing unit is configured to determine an operational status of the magnetic resonance imaging device in dependence of the information indicating the status of the cryocooler and/or the information on the parameter of the superconducting magnet, wherein the control unit is configured to provide a control signal configured to control the ramping process of the superconducting magnet, and wherein the control signal depends on the determined operational status of the magnetic resonance imaging device and on the information indicating the status of the cryocooler.

In an embodiment, the inventive magnetic resonance imaging device is configured to perform a method according to any of the embodiments described herein. The processing unit and the at least one interface may be integrated within the control unit of the magnetic resonance imaging device. However, the processing unit and the at least one interface may also be separate or standalone components.

In one embodiment, the magnetic resonance imaging device comprises a first interface for receiving the information indicating the status of the cryocooler and a second interface for receiving the information on the parameter of the superconducting magnet. It is also conceivable that the information indicating the status of the cryocooler and the information on the parameter of the superconducting magnet are received by a single interface. The magnetic resonance imaging device may further comprise an output interface configured for outputting the control signal. The control signal may be transmitted to any component controlling a ramping process of the magnetic resonance imaging device, such as a switch controlling an electrical current in the superconducting magnet, a controlling unit of the cryocooler, and/or any control unit and/or logic unit for controlling the ramping process.

In an embodiment, the superconducting magnet of the magnetic resonance imaging device comprises a dry magnet technology. A dry magnet technology may be characterized by a low amount of cryogenic fluid in comparison to conventional magnetic resonance imaging devices comprising a wet magnet technology. For instance, the inventive magnetic resonance imaging device may be characterized by the coils of the superconducting magnet not being immersed in a condensed phase of the cryogenic fluid.

The embodiments of the magnetic resonance imaging device share the advantages of the any of the embodiments of the methods described above.

The inventive computer program product can be loaded into a memory of a programmable processing unit of a magnetic resonance imaging device according to an embodiment described above, and comprises program code means to perform a method according to the embodiments described herein when the computer program product is executed in the processing unit of the magnetic resonance imaging device.

As a result, the method according to the embodiments described herein can be carried out quickly and in a robust and repeatable manner. The computer program product is configured in such a way that it can carry out the steps according to the method by means of the processing unit. The processing unit in each case may comprise various components such as a corresponding main memory, a corresponding graphics card, or a corresponding logic unit, so that the respective method steps can be carried out efficiently.

The computer program product may be, for example, stored on a non-transitory computer-readable medium or stored on a network, a server or a cloud, from where it can be loaded into the processor of a local processing unit. The local processing unit can be directly connected to the magnetic resonance imaging device or designed as part of the magnetic resonance imaging device. Furthermore, control information of the computer program product can be stored on an electronically readable medium. The control information on the electronically readable medium can be designed in such a way that, when the medium is used, it carries out a method according to any of the embodiments described herein in a processing unit of the magnetic resonance imaging device. Examples of an electronically readable medium are a DVD, a magnetic tape or a USB stick on which electronically readable control information, e.g. software, is stored. If this control information is read from the medium and stored in a control unit and/or a processing unit of a magnetic resonance imaging device, any of the method embodiments described herein can be carried out.

BRIEF DESCRIPTION OF THE DRAWINGS

Further advantages and details of the present disclosure may be recognized from the embodiments described below as well as the drawings. The figures show.

DETAILED DESCRIPTION OF THE DISCLOSURE

Figure 1:
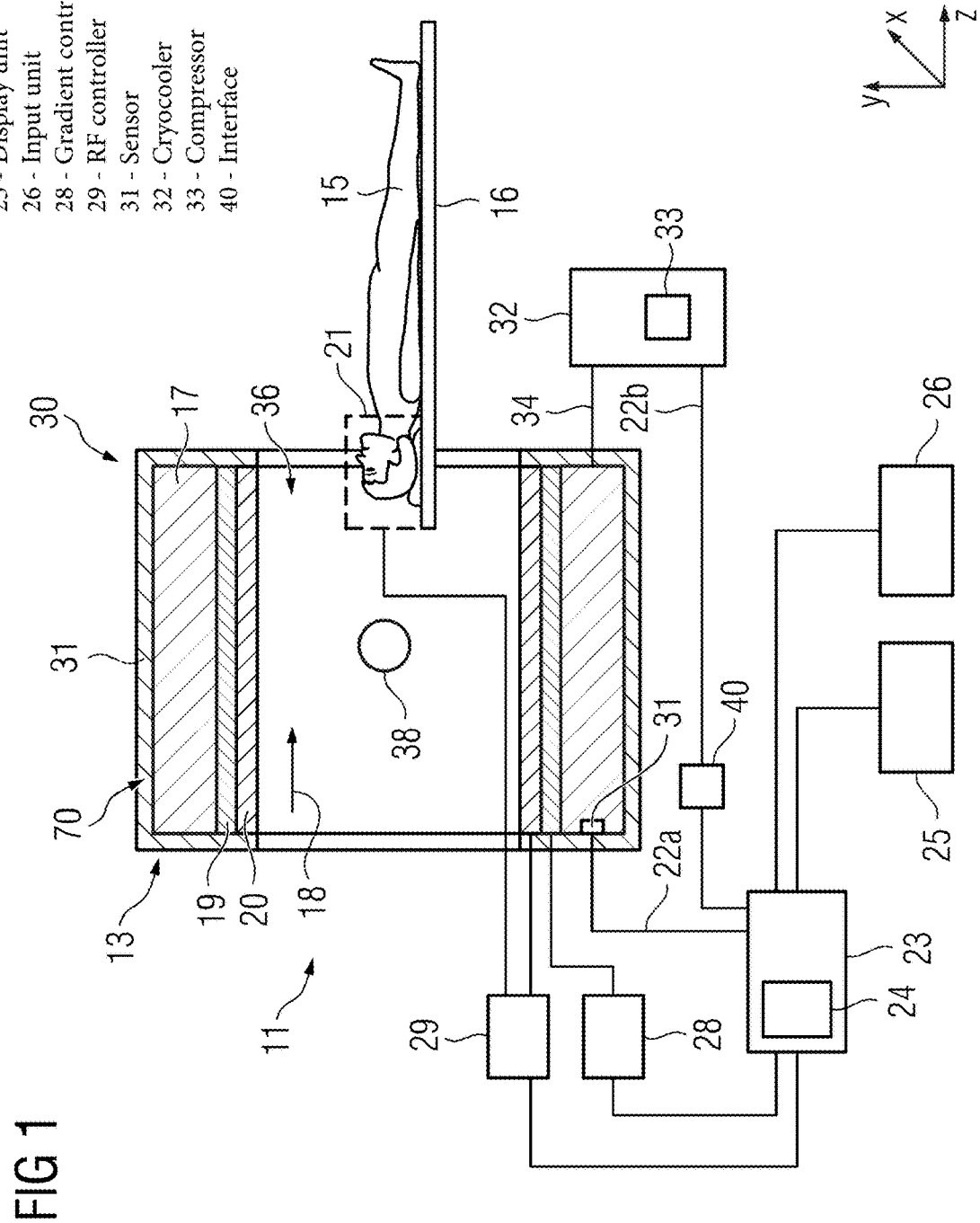
FIG. 1 illustrates a schematic representation of a magnetic resonance imaging system according to one or more embodiments of the disclosure.

FIG. 1 shows an embodiment of a magnetic resonance imaging system 11 according to one or more embodiments of the disclosure. The magnetic resonance imaging system 11 comprises a magnetic resonance imaging device 13 with a static field magnet 17 that provides a homogenous, static magnetic field 18 (B0 field). The static magnetic field 18 comprises an isocenter 38 and a cylindrical imaging region 36 for receiving a patient 15. The imaging region 36 is surrounded by the magnet arrangement 30 in a circumferential direction. The patient support 16 is configured to transport the patient 15 into the imaging region 36. For instance, the patient support 16 may transport a diagnostically relevant region of the patient 15 into an imaging volume defined by the isocenter 38 of the magnetic resonance imaging device 13. In an embodiment, the magnetic resonance imaging device 13 is screened from an environment by a housing shell 31.

The magnetic resonance imaging device 13 further comprises a gradient magnet arrangement 19 configured to provide magnetic gradient fields used for spatial encoding of magnetic resonance signals acquired during a magnetic resonance imaging measurement. The gradient magnet arrangement 19 is activated or controlled by a gradient controller 28 via an appropriate current signal.

The magnetic resonance imaging device 13 further comprises a radiofrequency antenna 20 (body coil), which may be integrated into the magnetic resonance imaging device 13. The radiofrequency antenna 20 is operated via a radiofrequency controller 29 that controls the radiofrequency antenna 20 to generate a high frequency magnetic field and emit radiofrequency excitation pulses into an examination space, which is essentially formed by the imaging region 36. The magnetic resonance imaging system 11 may further comprise a local coil 21, which is positioned on or in proximity to the diagnostically relevant region of the patient 15. The local coil 21 may be configured to emit radiofrequency excitation pulses into the patient 15 and/or receive magnetic resonance signals from the patient 15. It is conceivable that the local coil 21 is controlled via the radiofrequency controller 29.

The magnetic resonance imaging system 11 further comprises a control unit (also referred to herein as control circuitry or a controller) 23 configured to control the magnetic resonance imaging system 11. The control unit 23 may comprise a processing unit (also referred to herein one or more processors or processing circuitry) 24 configured to process magnetic resonance signals and reconstruct magnetic resonance images. The processing unit 24 may also be configured to process input from a user of the magnetic resonance imaging device 13 and/or provide an output to a user. For this purpose, the processing unit 24 and/or the control unit 23 can be connected to a display unit (also referred to herein as a display) 25 and an input unit (also referred to herein as input circuitry or a user interface) 26 via a suitable signal connection. For a preparation of a magnetic resonance imaging measurement, preparatory information, such as imaging parameters or patient information, can be provided to the user via the display unit 25. The input unit 26 may be configured to receive information and/or imaging parameters from the user. The display unit 25 and the input unit 26 may also be implemented as a combined interface, such as a touch interface.

The magnetic resonance imaging system 11 further comprises a cryocooler 32 configured to cool coils of a superconducting magnet in the magnet arrangement 30 below a predefined temperature in the range of a superconducting temperature of the superconducting magnet. The cryocooler 32 may comprise a compressor 33 supplying pressurized gas to the cryocooler 32. According to the embodiment shown in FIG. 1, the cryocooler 32 also comprises a thermal connection 34 configured to transport heat energy out of the magnet arrangement 30. The thermal connection 34 may be implemented as a coldhead comprising one or more cooling stages. In a preferred embodiment, at least one cooling stage of the coldhead is thermally coupled to the coils of the superconducting magnet.

In the embodiment shown in FIG. 1, the cryocooler 32 comprises a signal connection 22b with an interface 40 of the magnetic resonance imaging system 11. The signal connection 22b may be configured for transmitting information from the cryocooler 32 to the magnetic resonance imaging device 13, and vice versa. Such information may, for example, comprise control signals, but also information indicating a turn-off time of the compressor 33 of the cryocooler 32. The signal connection 22b may be implemented as a wired connection or a wireless connection.

According to the embodiment shown in FIG. 1, the magnetic resonance imaging system 11 comprises a sensor 31 configured to determine an electrical voltage of a coil of the superconducting magnet. The electrical voltage of a coil of the superconducting magnet may be transmitted to the control unit 23 of the magnetic resonance imaging device 13 via the signal connection 22a. It is also conceivable that the sensor 31 is coupled to the interface 40. The magnetic resonance imaging system 11 may comprise another sensor and/or additional sensors according to an embodiment described above. For example, the magnetic resonance imaging may comprise a temperature sensor for assessing a temperature level of a cryogen within the cryocooler 32 and/or a pressure sensor configured to determine a pressure level of a pressure line and/or a buffer tank connected to the compressor 33 (not shown).

Of course, the magnetic resonance imaging system 11 may comprise further components that magnetic resonance imaging systems usually exhibit. The general operation of a magnetic resonance imaging system 11 is known to those skilled in the art, so a more detailed description is not deemed necessary.

Figure 2:
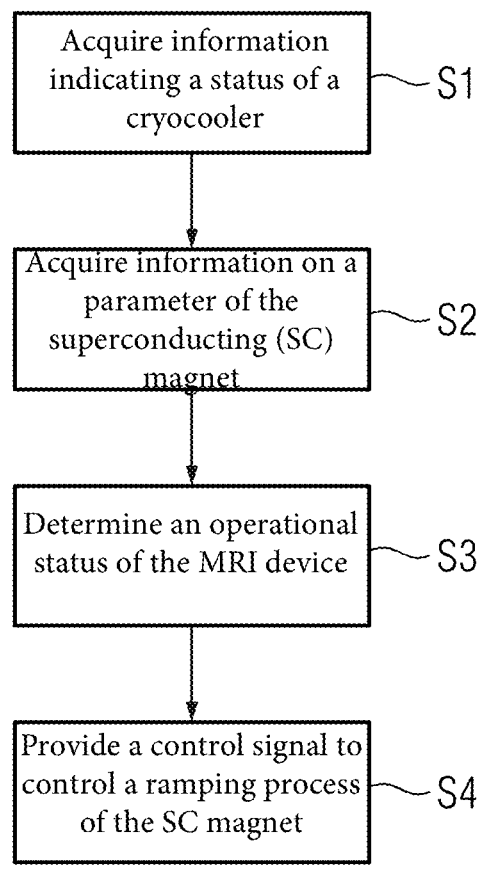
FIG. 2 illustrates a flow diagram of a method according to one or more embodiments of the disclosure.

FIG. 2 illustrates a flow diagram of a method according to one or more embodiments of the disclosure, which includes e.g. a computer-implemented method for controlling a ramping process of a superconducting magnet of a magnetic resonance imaging device 13.

In a step S1, information indicating a status of a cryocooler 32 configured for cooling of the superconducting magnet is acquired via an interface 40. In an embodiment, the information indicating the status of the cryocooler 32 comprises a turn-off time, e. g. a time value quantifying a period of time that has lapsed since the compressor 33 has lastly ceased to operate. The information indicating the status of the cryocooler 32 may be received by the interface 40 via signal connection 22b.

A step S2 comprises acquiring information on a parameter of the superconducting magnet via an interface. For example, the information on the parameter of the superconducting magnet may be acquired by the at least one sensor 31 (see FIG. 1) configured to determine an electrical voltage of a coil of the superconducting magnet. The information on the parameter of the superconducting magnet may then be transmitted to the control unit 23 via the signal connection 22a. The interface for receiving the information on the parameter of the superconducting magnet may be incorporated within the control unit 23 (not shown in FIG. 1). However, the sensor may also transmit the information on the parameter of the superconducting magnet to the interface 40, which is connected to the control unit 23.

According to an embodiment, acquiring the information on the parameter of the superconducting magnet comprises acquiring a value of an electrical property and/or a physical property of the superconducting magnet via the at least one sensor 31. The information on the parameter of the superconducting magnet acquired via the at least one sensor 31 may comprise, for example, an electrical voltage, an electrical current, a magnetic field, and/or a temperature of the superconducting magnet.

In a step S3, an operational status of the magnetic resonance imaging device is determined in dependence of the information indicating the status of the cryocooler 32 and/or the information on the parameter of the superconducting magnet via a processing unit 24. In one example, a readiness of the magnetic resonance imaging device 13 to perform a magnetic resonance imaging measurement is assessed at least in dependence of the information on the parameter of the superconducting magnet. It is conceivable that the operational status of the magnetic resonance imaging device 13 is also determined based on the information indicating the status of the cryocooler 32. For example, if the turn-off time of the compressor 33 is determined to be lower than a reference time, the magnetic resonance imaging device 13 may be estimated to be fully operational and the method may repeat from step S1.

In one embodiment, determining the operational status of the magnetic resonance imaging device 13 comprises correlating the turn-off time of the compressor 33 with at least one reference time. In an embodiment, determining the operational status of the magnetic resonance imaging device 13 comprises correlating the turn-off time of the compressor 33 with at least a first reference time and a second reference time.

For example, the second reference time relates to a turn-off time of the compressor 33 where temperature problems in the superconducting magnet are expected when performing a magnetic resonance imaging measurement. Thus, in case the turn-off time of the compressor 33 exceeds the second reference time, a control signal may be provided via the control unit 23 to intentionally ramp down the superconducting magnet and to avoid an unintended ramp-down (or emergency ramp down) during a magnetic resonance imaging measurement.

The first reference time may relate to a turn-off time of the compressor 33 where temperature problems in the superconducting magnet can be dismissed. For example, the superconducting magnet may be able to perform one or more magnetic resonance imaging measurements or imaging sequences without causing an unintended ramp-down. However, the first reference time may also relate to a turn-off time of the compressor 33 that allows performing a magnetic resonance imaging measurement only under certain conditions. Such conditions may comprise a restriction of a number of imaging sequences to be performed, but also a restriction to a specific magnetic resonance imaging measurement or a set of specific magnetic resonance imaging measurements.

According to a further embodiment, determining the operational status of magnetic resonance imaging device 13 comprises assessing a readiness of the superconducting magnet for performing a magnetic resonance imaging measurement in dependence of the information on the parameter of the superconducting magnet. For example, the superconducting magnet may be assessed as being ready for measurement if the electrical current, the electrical voltage, the temperature, and/or the magnetic field of the superconducting magnet lie within predefined value ranges. In an embodiment, if the temperature of the superconducting magnet is below or equal to a superconducting temperature and/or the electrical voltage of a coil of the superconducting magnet corresponds to an operating voltage of the superconducting magnet, the operational status of the magnetic resonance imaging device 13 is assessed as "ready".

Determining the operational status of the magnetic resonance imaging device 13 may also comprise detecting a present ramping process in dependence of the information on the parameter of the superconducting magnet, wherein the magnetic resonance imaging device 13 is assessed as being unready for performing a magnetic resonance measurement. In an embodiment, the operational status of the magnetic resonance imaging device 13 may be determined as being "unready" if the electrical voltage of a coil of the superconducting magnet lies within a predefined value range indicating a ramping process of the superconducting magnet.

For example, the operational status of the magnetic resonance imaging device 13 comprises assessing the superconducting magnet to be ramping down if the electrical voltage of the superconducting magnet is below a predefined value, e.g. below 100 mV. In contrast, the superconducting magnet may be assessed as ramping up when the electrical voltage of the superconducting magnet exceeds a predefined value, e.g. 100 mV.

According to a step S4, a control signal is provided via a control unit 23, wherein the control signal is configured to control the ramping process of the superconducting magnet, and wherein the control signal depends on the determined operational status of the magnetic resonance imaging device 13 and on the information indicating the status of the cryocooler 32. Depending on the operational status of the magnetic resonance imaging device 13, the control signal may be configured to initiate a ramp-up process or a ramp-down process of the superconducting magnet. It is conceivable that the control signal is directed at an electronic circuit configured for energizing and/or de-energizing the superconducting magnet. However, the control signal may also be transmitted to a control unit of the cryocooler 32 to align the cooling of the superconducting magnet with the ramping process. The control signal may be transmitted via the signal connection 22b or any other suitable signal connection.

In one embodiment, providing the control signal comprises providing a signal for ramping down the superconducting magnet if the operational status of the magnetic resonance imaging device 13 is assessed as being ready for performing a magnetic resonance measurement. In a further embodiment, providing the control signal comprises providing a signal for interrupting a ramp-up of the superconducting magnet.

Figure 3:
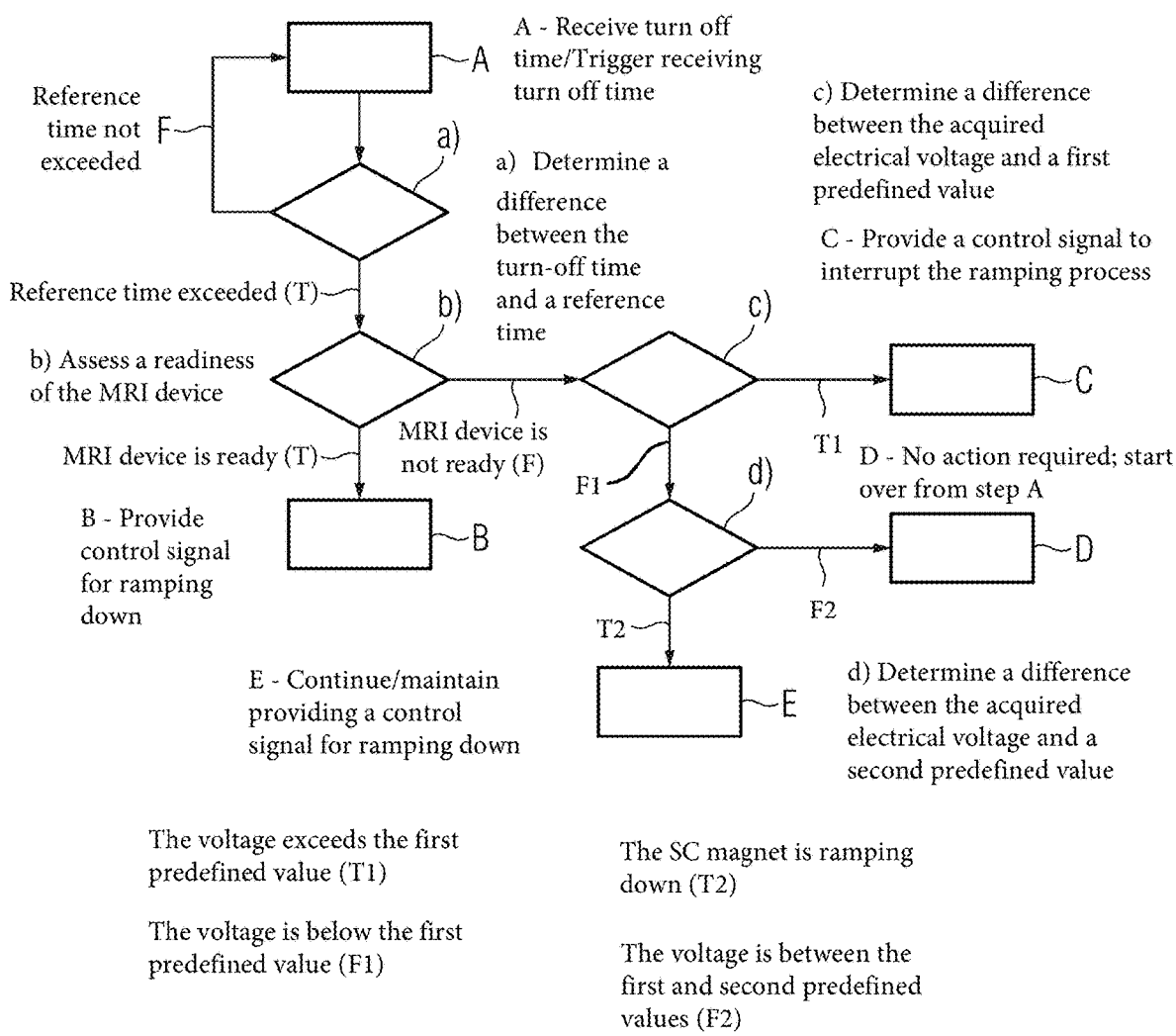
FIG. 3 illustrates a flow chart of a method according to one or more embodiments of the disclosure.

FIG. 3 illustrates a flow chart of a method according to one or more embodiments of the disclosure.

In step A, the turn-off time of the compressor 33 is received via the interface 40. Step A may also comprise triggering or initiating the acquisition of the turn-off time of the compressor 33 via the interface 40.

In step a), determining of the operational status of the magnetic resonance imaging device 13 comprises determining a difference between the turn-off time of the compressor 33 and at least one reference time. If the at least one reference time is exceeded ("T"), the method progresses to step b). Otherwise, steps A and a) are repeated ("F").

In step b), determining the operational status of the magnetic resonance imaging device 13 comprises assessing a readiness of the superconducting magnet of the magnet assembly 30 for performing a magnetic resonance imaging measurement in dependence of an electrical property of the superconducting magnet. For this purpose, an electrical voltage of the superconducting magnet is acquired via sensor 31 and transmitted to an interface of the control unit 23 and/or processing unit 24. If the operational status of the magnetic resonance imaging device 13 is assessed as being "ready" ("T"), the control unit 23 provides a control signal to ramp down the superconducting magnet, as shown in step B. Otherwise, the method progresses to step c).

In step c), determining the operational status of the magnetic resonance imaging device 13 comprises determining a difference between the acquired electrical voltage and a first predefined value of 100 mV. If the acquired electrical voltage exceeds the first predefined value ("T1"), the superconducting magnet is ramping up. Consequently, in step C, a control signal is provided to interrupt the ramping process of the superconducting magnet. In case the acquired electrical voltage is below the first predefined value ("F1"), the method proceeds to step d).

In step d), determining the operational status of the magnetic resonance imaging device 13 comprises determining a difference between the acquired electrical voltage and a second predefined value of 100 mV. If the acquired electrical voltage is below the second predefined value ("T2"), the superconducting magnet is ramping down. Thus, a control signal for ramping down the magnet may already be provided and is maintained in step E. Otherwise, the electrical voltage is situated between the first predefined value and the second predefined value ("F2"). In this case, no action is required as the superconducting magnet is not in an operational state and no ramping process is occurring. The inventive method starts over from A, as indicated in step D.

It shall be understood that the embodiments described above are to be recognized as examples. Individual embodiments may be extended by features of other embodiments. The sequence of the steps of the methods are to be understood as exemplary. The individual steps may be carried out in a different order and/or overlap partially or completely in time.

The various components described herein may be referred to as "units." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer readable medium. Regardless of the particular implementation, such units, as applicable and relevant, may alternatively be referred to herein as "circuitry," "controllers," "processors," or "processing circuitry," or alternatively as noted herein.

What is claimed is:

1. A computer-implemented method for controlling a ramping process of a superconducting magnet of a magnetic resonance imaging device, comprising:
   receiving, via an interface, cryocooler status data indicative of a status of a cryocooler configured to cool the superconducting magnet;
   receiving, via the interface, superconducting magnet data indicative of a parameter of the superconducting magnet comprising a value of an electrical property and/or a physical property of the superconducting magnet that is measured via at least one sensor;
   determining, via processing circuitry, an operational status of the magnetic resonance imaging device based upon (i) the cryocooler status data, and (ii) the superconducting magnet data; and
   generating, via a controller, a control signal that controls the ramping process of the superconducting magnet,
   wherein the control signal is from among a set of dedicated control signals, each respective one of the dedicated control signals being generated based upon the determined operational status of the magnetic resonance imaging device and the cryocooler status data to control the ramping process of the superconducting magnet in response to (i) the cryocooler status data indicating that a turn-off time of a compressor of the cryocooler exceeds a predetermined threshold time period, and (ii) the superconducting magnet data.

2. The method according to claim 1, wherein the superconducting magnet data acquired via the at least one sensor comprises a voltage, a current, a magnetic field, and/or a temperature of the superconducting magnet.

3. The method according to claim 1, wherein the receiving the cryocooler status data comprises:
   acquiring data indicative of a capacity of the cryocooler for maintaining a predefined cooling condition.

4. The method according to claim 1, wherein the receiving the cryocooler status data comprises:
   acquiring the turn-off time of the compressor of the cryocooler, and
   wherein the determining the operational status of the magnetic resonance imaging device comprises:
   correlating the turn-off time of the compressor with at least one reference time to determine whether the turn-off time of the compressor of the cryocooler exceeds the predetermined threshold time period.

5. The method according to claim 4, wherein the at least one reference time comprises a first reference time and a second reference time, and
   wherein the determining the operational status of the magnetic resonance imaging device comprises:
   correlating the turn-off time of the compressor with the first reference time and the second reference time.

6. The method according to claim 4, wherein:
   the at least one reference time comprises a first reference time and a second reference time,
   the determining the operational status of the magnetic resonance imaging device comprises correlating the turn-off time of the compressor with the first reference time and the second reference time to determine if a magnetic resonance measurement may be performed.

7. The method according to claim 6, wherein the generating the control signal comprises generating the respective dedicated control signal such that the superconducting magnet is ramped down prior to performing the magnetic resonance measurement in response to (i) the cryocooler status data indicating that a turn-off time of the compressor of the cryocooler exceeds the first and the second reference time, and (ii) the superconducting magnet data indicating that the magnetic resonance imaging device is ready to perform the magnetic resonance measurement.

8. The method according to claim 1, wherein the determining the operational status of the magnetic resonance imaging device comprises:
   assessing a readiness of the superconducting magnet to perform a magnetic resonance imaging measurement based upon the superconducting magnet data.

9. The method according to claim 8, wherein when the operational status of the magnetic resonance imaging device is assessed as being ready to perform the magnetic resonance imaging measurement, the generating the control signal comprises:
   generating the control signal for ramping down the superconducting magnet.

10. The method according to claim 8, wherein the determining the operational status of the magnetic resonance imaging device comprises:
when a present ramping process is detected based upon the superconducting magnet data, the magnetic resonance imaging device is assessed as being unready to perform the magnetic resonance imaging measurement.

11. The method according to claim 1, wherein the receiving the superconducting magnet data comprises acquiring a voltage of the superconducting magnet via the at least one sensor, and
wherein the determining the operational status of the magnetic resonance imaging device comprises:
assessing the superconducting magnet to be ramping down when the voltage of the superconducting magnet is less than a predefined value.

12. The method according to claim 1, wherein the receiving the superconducting magnet data comprises acquiring a voltage of the superconducting magnet via the at least one sensor, and
wherein the determining the operational status of the magnetic resonance imaging device comprises:
assessing the superconducting magnet to be ramping up when the voltage of the superconducting magnet exceeds a predefined value.

13. The method according to claim 1, wherein the generating the control signal comprises:
generating the control signal for interrupting a ramping up of the superconducting magnet.

14. The method according to claim 1, wherein the generating the control signal comprises generating the control signal that controls the ramping process of the superconducting magnet by (i) triggering initiation of a ramp-up process or a ramp-down process, (ii) maintaining a current ramp-up or a current ramp-down process, or (iii) interrupting a current ramp-up or a current ramp-down process.

15. The method according to claim 1, wherein each respective one of the dedicated control signals is generated based upon the determined operational status of the magnetic resonance imaging device and the cryocooler status data such that the superconducting magnet is ramped down prior to performing a magnetic resonance measurement in response to (i) the cryocooler status data indicating that the turn-off time of the compressor of the cryocooler exceeds the predetermined threshold time period, and (ii) the superconducting magnet data indicating that the magnetic resonance imaging device is ready to perform the magnetic resonance measurement.

16. A magnetic resonance imaging system, comprising:
a magnetic resonance imaging device;
a superconducting magnet;
an interface configured to receive cryocooler status data indicative of a status of a cryocooler and superconducting magnet data indicative of a parameter of the superconducting magnet comprising a value of an electrical property and/or a physical property of the superconducting magnet that is measured via at least one sensor;
processing circuitry configured to determine an operational status of the magnetic resonance imaging device based upon the cryocooler status data and the superconducting magnet data; and
a controller configured to generate a control signal that controls a ramping process of the superconducting magnet,
wherein the control signal is from among a set of dedicated control signals, each respective one of the dedicated control signals being generated based upon the determined operational status of the magnetic resonance imaging device and the cryocooler status data to control the ramping process of the superconducting magnet in response to (i) the cryocooler status data indicating that a turn-off time of a compressor of the cryocooler exceeds a predetermined threshold time period, and (ii) the superconducting magnet data.

\* \* \* \* \*